(12) United States Patent
Masuoka et al.

(10) Patent No.: US 10,490,681 B2
(45) Date of Patent: Nov. 26, 2019

(54) SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 0 days.

(21) Appl. No.: 15/793,366

(22) Filed: Oct. 25, 2017

(65) Prior Publication Data

US 2018/0062009 A1 Mar. 1, 2018

Related U.S. Application Data

(63) Continuation of application No. PCT/JP2015/079195, filed on Oct. 15, 2015.

(51) Int. Cl.
*H01L 29/78* (2006.01)
*H01L 31/0352* (2006.01)
(Continued)

(52) U.S. Cl.
CPC .... *H01L 31/035236* (2013.01); *H01L 29/151* (2013.01); *H01L 29/0684* (2013.01)

(58) Field of Classification Search
CPC ............... H01L 29/151; H01L 29/7827; H01L 29/42392; H01L 29/7831; H01L 31/035236; H01L 29/0684
See application file for complete search history.

(56) References Cited

U.S. PATENT DOCUMENTS

2004/0256639 A1 12/2004 Ouyang et al.
2004/0262681 A1 12/2004 Masuoka et al.
(Continued)

FOREIGN PATENT DOCUMENTS

JP 2004-356314 A 12/2004
JP 2005-012213 A 1/2005
(Continued)

OTHER PUBLICATIONS

The International Bureau of WIPO, International Preliminary Report on Patentability in Application No. PCT/JP2015/079195 dated Apr. 26, 2018, pp. 1-6.
(Continued)

*Primary Examiner* — Matthew C Landau
*Assistant Examiner* — Dmitry Yemelyanov
(74) *Attorney, Agent, or Firm* — Brinks Gilson & Lione

(57) ABSTRACT

A semiconductor device includes a pillar-shaped semiconductor layer formed on a planar semiconductor layer, a first insulator surrounding the pillar-shaped semiconductor layer, a first gate surrounding the first insulator and made of a metal having a first work function, a second gate surrounding the first insulator and made of a metal having a second work function different from the first work function, a third gate surrounding the first insulator and made of a metal having the first work function, a first metal layer surrounding the first insulator and having a third work function, and a second metal layer surrounding the first insulator and having the third work function. The first gate, the second gate, and the third gate are electrically connected together.

17 Claims, 2 Drawing Sheets

(51) Int. Cl.
    *H01L 29/15*    (2006.01)
    *H01L 29/06*    (2006.01)

(56) References Cited

U.S. PATENT DOCUMENTS

| | | |
|---|---|---|
| 2008/0173933 A1 | 7/2008 | Fukuzumi et al. |
| 2009/0242869 A1 | 10/2009 | Hovel et al. |
| 2011/0147837 A1 | 6/2011 | Hafez et al. |
| 2013/0015500 A1 | 1/2013 | Izumida et al. |
| 2014/0209998 A1* | 7/2014 | Masuoka .......... H01L 29/42392 257/329 |

FOREIGN PATENT DOCUMENTS

| | | |
|---|---|---|
| JP | 2008-172164 A | 7/2008 |
| JP | 2009-200434 A | 9/2009 |
| JP | 2011-519730 A | 7/2011 |
| JP | 2013-021274 A | 1/2013 |
| JP | 2013-514663 A | 4/2013 |
| JP | 5759077 B1 | 8/2015 |
| WO | WO 2014/115305 A1 | 7/2014 |

OTHER PUBLICATIONS

International Search Report, and English language translation thereof, in corresponding International Application No. PCT/JP2015/079195, dated Jan. 12, 2016, 5 pages.

* cited by examiner

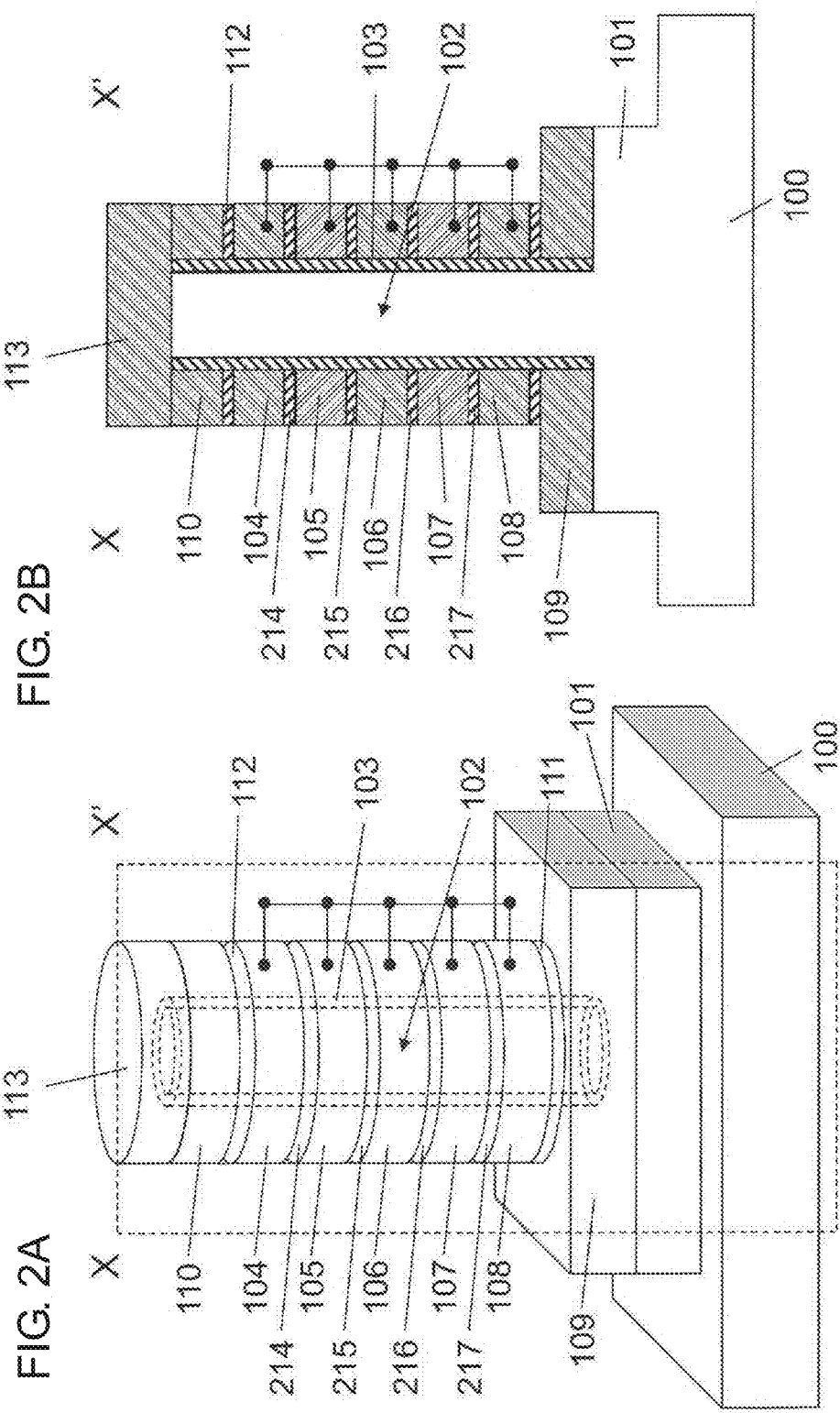

SEMICONDUCTOR DEVICE

RELATED APPLICATIONS

The present application is a continuation application of PCT/JP2015/079195, filed Oct. 15, 2015, the entire contents of which are incorporated herein by reference.

BACKGROUND OF THE INVENTION

1. Field of the Invention

The present invention relates to semiconductor devices.

2. Description of the Related Art

It has been reported that a surrounding gate transistor (SGT) in the related art with a short gate length exhibits an increased drain current due to ballistic conduction (see, for example, Japanese Unexamined Patent Application Publication No. 2009-200434). Ballistic conduction is a phenomenon in which carriers travel from the source to the drain without being scattered if the channel length (gate length) is shorter than the mean free path of the carriers.

However, it has been reported that an SGT in the related art exhibits an increased subthreshold swing if the gate length is 10 nm or less for a silicon pillar diameter of 5 nm (see, for example, Japanese Unexamined Patent Application Publication No. 2004-356314).

It has also been reported that a substrate including various alternating semiconductor layers such as Si/SiGe/Si/SiGe, Si/Ge/Si/Ge, or n-Si/p-Si/n-Si alternating layers is etched to form semiconductor nanowires with embedded quantum wells or a superlattice structure within the semiconductor nanowires (see, for example, Japanese Unexamined Patent Application Publication No. 2011-519730). However, Si/SiGe/Si/SiGe and Si/Ge/Si/Ge alternating layers have interfaces between the substances, which can result in defects. For n-Si/p-Si/n-Si alternating layers, impurity position control is difficult. In addition, the impurities themselves scatter carriers.

SUMMARY OF THE INVENTION

Accordingly, it is an object of the present invention to provide a semiconductor device having a structure including a pillar-shaped semiconductor layer in which a superlattice or quantum-well structure is formed due to work function differences between metals and a semiconductor or a semiconductor device that can operate at high speed.

A semiconductor device according to one aspect of the present invention includes a planar semiconductor layer formed on a substrate; a pillar-shaped semiconductor layer formed on the planar semiconductor layer; a first insulator surrounding the pillar-shaped semiconductor layer; a first gate surrounding the first insulator and made of a metal having a first work function; a second gate surrounding the first insulator and made of a metal having a second work function different from the first work function, the second gate being located below the first gate; a third gate surrounding the first insulator and made of a metal having the first work function, the third gate being located below the second gate; a first metal layer surrounding the first insulator and having a third work function, the first metal layer being located above the first gate, the first metal layer being electrically connected to an upper portion of the pillar-shaped semiconductor layer, the first metal layer being electrically insulated from the first gate; and a second metal layer surrounding the first insulator and having the third work function, the second metal layer being located below the third gate, the second metal layer being electrically connected to a lower portion of the pillar-shaped semiconductor layer, the second metal layer being electrically insulated from the third gate. The first gate, the second gate, and the third gate are electrically connected together.

The second metal layer may be in contact with an upper surface of the planar semiconductor layer.

The second metal layer may extend over the planar semiconductor layer.

The semiconductor device may further include a third metal layer connecting the first metal layer to the upper portion of the pillar-shaped semiconductor layer.

The semiconductor device may further include a second insulating film between the first gate and the first metal layer.

The semiconductor device may further include a third insulating film between the third gate and the second metal layer.

The semiconductor device may further include a fourth gate surrounding the first insulator and made of a metal having the second work function different from the first work function, the fourth gate being located below the third gate, the fourth gate being located above the second metal layer. The first gate, the second gate, the third gate, and the fourth gate may be electrically connected together.

The semiconductor device may further include a fifth gate surrounding the first insulator and made of a metal having the first work function, the fifth gate being located below the fourth gate, the fifth gate being located above the second metal layer. The first gate, the second gate, the third gate, the fourth gate, and the fifth gate may be electrically connected together.

The third work function may be 4.0 eV to 4.2 eV.
The second work function may be 4.0 eV to 4.2 eV.
The first work function may be 4.2 eV or more.
The third work function may be 5.0 eV to 5.2 eV.
The second work function may be 5.0 eV to 5.2 eV.
The first work function may be 5.0 eV or less.

The semiconductor device may further include a fourth insulating film formed between the first gate and the second gate and a fifth insulating film formed between the second gate and the third gate.

The semiconductor device may further include a sixth insulating film formed between the third gate and the fourth gate.

The semiconductor device may further include a seventh insulating film formed between the fourth gate and the fifth gate.

According to these aspects, a semiconductor device having a structure including a pillar-shaped semiconductor layer in which a superlattice or quantum-well structure is formed due to work function differences between metals and a semiconductor or a semiconductor device that can operate at high speed can be provided.

A semiconductor device according to one aspect of the present invention includes a planar semiconductor layer formed on a substrate; a pillar-shaped semiconductor layer formed on the planar semiconductor layer; a first insulator surrounding the pillar-shaped semiconductor layer; a first gate surrounding the first insulator and made of a metal having a first work function; a second gate surrounding the first insulator and made of a metal having a second work function different from the first work function, the second gate being located below the first gate; and a third gate surrounding the first insulator and made of a metal having the first work function, the third gate being located below the second gate. The first gate, the second gate, and the third gate are electrically connected together.

For example, if the pillar-shaped semiconductor layer is a pillar-shaped silicon layer, the first work function is 5.0 eV to 5.2 eV, which is close to the work function of p-type silicon, i.e., 5.15 eV, and the second work function is 4.0 eV to 4.2 eV, which is close to the work function of n-type silicon, i.e., 4.05 eV, then the portions of the pillar-shaped semiconductor layer surrounded by the first gate and the third gate function as p-type silicon, and the portion of the pillar-shaped semiconductor layer surrounded by the second gate functions as n-type silicon. The portion that functions as p-type silicon, the portion that functions as n-type silicon, and the portion that functions as p-type silicon can form a superlattice or quantum-well structure in the pillar-shaped semiconductor layer due to the work function differences between the metals and the semiconductor.

In this case, since a superlattice or quantum-well structure is formed in the pillar-shaped semiconductor layer due to the work function differences between the metals and the semiconductor, there is no interface between the portions that function as p-type silicon and the portion that functions as n-type silicon, which results in reduced defects. In addition, since no impurity is used, no impurity position control is required, and the scattering of carriers due to impurities can be avoided.

The semiconductor device further includes a first metal layer surrounding the first insulator and having a third work function, the first metal layer being located above the first gate, the first metal layer being electrically connected to an upper portion of the pillar-shaped semiconductor layer, the first metal layer being electrically insulated from the first gate; and a second metal layer surrounding the first insulator and having the third work function, the second metal layer being located below the third gate, the second metal layer being electrically connected to a lower portion of the pillar-shaped semiconductor layer, the second metal layer being electrically insulated from the third gate. Due to the work function difference between the metal forming the first metal layer, which has the third work function, and the semiconductor, a region that functions as an n-type semiconductor layer or a region that functions as a p-type semiconductor layer, i.e., a region that functions as a source or drain, can be formed in the upper portion of the pillar-shaped semiconductor layer. Due to the work function difference between the metal forming the second metal layer, which has the third work function, and the semiconductor, a region that functions as an n-type semiconductor layer or a region that functions as a p-type semiconductor layer, i.e., a region that functions as a source or drain, can be formed in the lower portion of the pillar-shaped semiconductor layer.

For example, if the pillar-shaped semiconductor layer is a pillar-shaped silicon layer, the first gate and the third gate have a height that allows ballistic conduction, the third work function is 4.0 eV to 4.2 eV, which is close to the work function of n-type silicon, i.e., 4.05 eV, the second work function is 4.0 eV to 4.2 eV, which is close to the work function of n-type silicon, i.e., 4.05 eV, and the first work function is 4.2 eV or more, then the portions of the pillar-shaped semiconductor layer surrounded by the first gate and the third gate function as a channel of a transistor, the portion of the pillar-shaped semiconductor layer surrounded by the second gate functions as n-type silicon, and the portions of the pillar-shaped semiconductor layer surrounded by the first metal layer and the second metal layer function as n-type silicon. The portion that functions as a channel, the portion that functions as n-type silicon, and the portion that functions as a channel form two series-connected transistors having ballistic conduction, thus providing a transistor having ballistic conduction with a long gate length.

The second metal layer may be in contact with an upper surface of the planar semiconductor layer. The portion of the upper surface of the planar semiconductor layer in contact with the second metal layer serves as a region that functions as an n-type semiconductor layer or a region that functions as a p-type semiconductor layer due to the work function difference between the metal forming the second metal layer, which has the third work function, and the semiconductor. Thus, the second metal layer can be electrically connected to the lower portion of the pillar-shaped semiconductor layer. In addition, the second metal layer and the lower portion of the pillar-shaped semiconductor layer are separated from each other only by the first insulator, which functions as a gate insulating film. Thus, low resistance can be achieved between the second metal layer and the lower portion of the pillar-shaped semiconductor layer. That is, low parasitic resistance can be achieved.

The second metal layer may extend over the planar semiconductor layer. Since the second metal layer is made of a metal, low resistance can be achieved between the lower portion of the pillar-shaped semiconductor layer and a contact connected to the second metal layer.

The semiconductor device may further include a fourth gate surrounding the first insulator and made of a metal having the second work function different from the first work function, the fourth gate being located below the third gate, the fourth gate being located above the second metal layer. The first gate, the second gate, the third gate, and the fourth gate may be electrically connected together. The semiconductor device may further include a fifth gate surrounding the first insulator and made of a metal having the first work function, the fifth gate being located below the fourth gate, the fifth gate being located above the second metal layer. The first gate, the second gate, the third gate, the fourth gate, and the fifth gate may be electrically connected together. Since the gates having the first work function and the gates having the second work function alternately surround the pillar-shaped semiconductor layer, they can form a superlattice in the pillar-shaped semiconductor layer.

In addition, since the gates having the first work function and the gates having the second work function alternately surround the pillar-shaped semiconductor layer, they form more than one series-connected transistors having ballistic conduction, thus providing a transistor having ballistic conduction with a long gate length.

The semiconductor device may further include a fourth insulating film formed between the first gate and the second gate and a fifth insulating film formed between the second gate and the third gate. The semiconductor device may further include a sixth insulating film formed between the third gate and the fourth gate. The semiconductor device may further include a seventh insulating film formed between the fourth gate and the fifth gate. These insulating films isolate the gates from each other, thus reducing the mixing of a metal having the first work function and a metal having the second work function and the formation of a compound between a metal having the first work function and a metal having the second work function.

BRIEF DESCRIPTION OF THE DRAWINGS

FIG. 2A is a perspective view of a semiconductor device according to an embodiment of the present invention.

FIG. 2B is a sectional view taken along plane X-X' in FIG. 2A.

DETAILED DESCRIPTION OF THE PREFERRED EMBODIMENTS

Figure 1A:
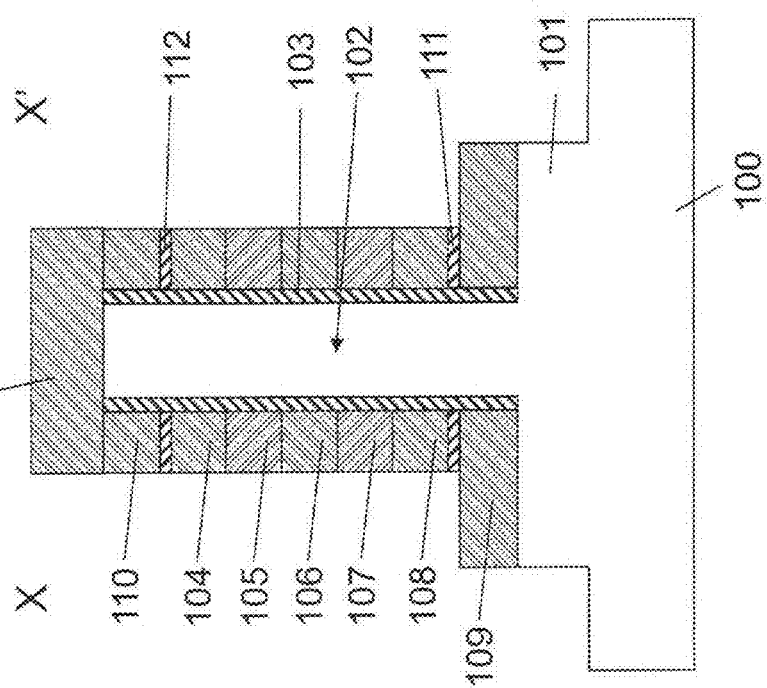
FIG. 1A is a perspective view of a semiconductor device according to an embodiment of the present invention.
Figure 1B:
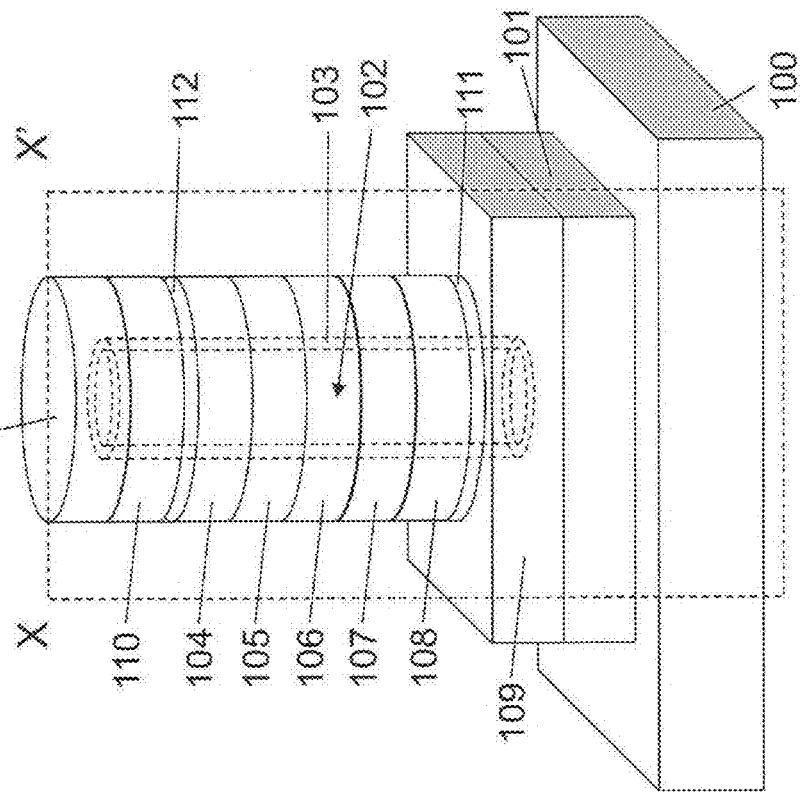
FIG. 1B is a sectional view taken along plane X-X' in FIG. 1A.

A semiconductor device according to an embodiment of the present invention will now be described with reference to FIGS. 1A and 1B. The semiconductor layer used in this embodiment is preferably a silicon layer. The semiconductor layer may also be made of a group IV semiconductor such as germanium (Ge) or carbon (C). The semiconductor layer may also be made of a group III-V compound semiconductor.

The semiconductor device includes a planar semiconductor layer 101 formed on a substrate 100; a pillar-shaped semiconductor layer 102 formed on the planar semiconductor layer 101; a first insulator 103 surrounding the pillar-shaped semiconductor layer 102; a first gate 104 surrounding the first insulator 103 and made of a metal having a first work function; a second gate 105 surrounding the first insulator 103 and made of a metal having a second work function different from the first work function, the second gate 105 being located below the first gate 104; a third gate 106 surrounding the first insulator 103 and made of a metal having the first work function, the third gate 106 being located below the second gate 105; a first metal layer 110 surrounding the first insulator 103 and having a third work function, the first metal layer 110 being located above the first gate 104, the first metal layer 110 being electrically connected to an upper portion of the pillar-shaped semiconductor layer 102, the first metal layer 110 being electrically insulated from the first gate 104; and a second metal layer 109 surrounding the first insulator 103 and having the third work function, the second metal layer 109 being located below the third gate 106, the second metal layer 109 being electrically connected to a lower portion of the pillar-shaped semiconductor layer 102, the second metal layer 109 being electrically insulated from the third gate 106. The first gate 104, the second gate 105, and the third gate 106 are electrically connected together.

The first insulator 103 functions as a gate insulating film. Preferably, the first insulator 103 is an oxide film, a nitride film, an oxynitride film, or a high-k dielectric film or includes at least one of an oxide film, a nitride film, an oxynitride film, and a high-k dielectric film.

The first gate 104 is in contact with the second gate 105 below the first gate 104, and the second gate 105 is in contact with the third gate 106 below the second gate 105. Thus, the first gate 104, the second gate 105, and the third gate 106 are electrically connected together.

For example, if the pillar-shaped semiconductor layer 102 is a pillar-shaped silicon layer, the first work function is 5.0 eV to 5.2 eV, which is close to the work function of p-type silicon, i.e., 5.15 eV, and the second work function is 4.0 eV to 4.2 eV, which is close to the work function of n-type silicon, i.e., 4.05 eV, then the portions of the pillar-shaped semiconductor layer 102 surrounded by the first gate 104 and the third gate 106 function as p-type silicon, and the portion of the pillar-shaped semiconductor layer 102 surrounded by the second gate 105 functions as n-type silicon. The portion that functions as p-type silicon, the portion that functions as n-type silicon, and the portion that functions as p-type silicon can form a superlattice or quantum-well structure in the pillar-shaped semiconductor layer 102 due to the work function differences between the metals and the semiconductor.

In this case, since a superlattice or quantum-well structure is formed in the pillar-shaped semiconductor layer 102 due to the work function differences between the metals and the semiconductor, there is no interface between the portions that function as p-type silicon and the portion that functions as n-type silicon, which results in reduced defects. In addition, since no impurity is used, no impurity position control is required, and the scattering of carriers due to impurities can be avoided.

Although the first work function is 5.0 eV to 5.2 eV and the second work function is 4.0 eV to 4.2 eV in the above example, a superlattice or quantum-well structure can be formed in the pillar-shaped semiconductor layer 102 as long as the first work function and the second work function are different from each other.

Due to the work function difference between the metal forming the first metal layer 110, which has the third work function, and the semiconductor, a region that functions as an n-type semiconductor layer or a region that functions as a p-type semiconductor layer, i.e., a region that functions as a source or drain, can be formed in the upper portion of the pillar-shaped semiconductor layer 102. Due to the work function difference between the metal forming the second metal layer 109, which has the third work function, and the semiconductor, a region that functions as an n-type semiconductor layer or a region that functions as a p-type semiconductor layer, i.e., a region that functions as a source or drain, can be formed in the lower portion of the pillar-shaped semiconductor layer 102.

For example, if the pillar-shaped semiconductor layer 102 is a pillar-shaped silicon layer, the first gate 104 and the third gate 106 have a height that allows ballistic conduction, the third work function is 4.0 eV to 4.2 eV, which is close to the work function of n-type silicon, i.e., 4.05 eV, the second work function is 4.0 eV to 4.2 eV, which is close to the work function of n-type silicon, i.e., 4.05 eV, and the first work function is 4.2 eV or more, then the portions of the pillar-shaped semiconductor layer 102 surrounded by the first gate 104 and the third gate 106 function as a channel of a transistor, the portion of the pillar-shaped semiconductor layer 102 surrounded by the second gate 105 functions as n-type silicon, and the portions of the pillar-shaped semiconductor layer 102 surrounded by the first metal layer 110 and the second metal layer 109 function as n-type silicon. The portion that functions as a channel, the portion that functions as n-type silicon, and the portion that functions as a channel form two series-connected transistors having ballistic conduction, thus providing a transistor having ballistic conduction with a long gate length.

The third work function is preferably 4.0 eV to 4.2 eV. The second work function is preferably 4.0 eV to 4.2 eV. Since the second work function is close to the work function of n-type silicon, i.e., 4.05 eV, the portion of the pillar-shaped semiconductor layer 102 surrounded by the second gate 105, which has the second work function, functions as n-type silicon if the pillar-shaped semiconductor layer 102 is made of silicon. For example, a compound between tantalum and titanium (TaTi) and tantalum nitride (TaN) are preferred.

The first work function is preferably 4.2 eV or more. If the first work function is 4.2 eV or more, a transistor including a channel formed by the gates having the first work function (first gate 104, third gate 106, and fifth gate 108) can operate as an n-type enhancement-mode transistor. For example, metals having mid-gap work functions, ruthenium (Ru), and titanium nitride (TiN) are preferred.

Although the third work function is 4.0 eV to 4.2 eV, the second work function is 4.0 eV to 4.2 eV, and the first work function is 4.2 eV or more in the above example, the first work function and the second work function may each be any work function that allows the semiconductor device to function as a transistor as long as the first work function and the second work function are different from each other. The third work function may also be any work function that allows the semiconductor device to function as a transistor.

If the semiconductor device is used as a p-channel metal-oxide-semiconductor (pMOS) transistor, the third work function is preferably 5.0 eV to 5.2 eV. The second work function is preferably 5.0 eV to 5.2 eV. Since the second work function is close to the work function of p-type silicon, i.e., 5.15 eV, the portion of the pillar-shaped semiconductor layer 102 surrounded by the second gate 105, which has the second work function, functions as p-type silicon if the pillar-shaped semiconductor layer 102 is made of silicon. For example, ruthenium (Ru) and titanium nitride (TiN) are preferred.

If the semiconductor device is used as a pMOS transistor, the first work function is preferably 5.0 eV or less. If the first work function is 5.0 eV or less, a transistor including a channel formed by the gates having the first work function (first gate 104, third gate 106, and fifth gate 108) can operate as a p-type enhancement-mode transistor. For example, metals having mid-gap work functions, a compound between tantalum and titanium (TaTi), and tantalum nitride (TaN) are preferred.

Although the third work function is 5.0 eV to 5.2 eV, the second work function is 5.0 eV to 5.2 eV, and the first work function is 5.0 eV or less in the above example, the first work function and the second work function may each be any work function that allows the semiconductor device to function as a transistor as long as the first work function and the second work function are different from each other. The third work function may also be any work function that allows the semiconductor device to function as a transistor.

The second metal layer 109 is in contact with an upper surface of the planar semiconductor layer 101. The portion of the upper surface of the planar semiconductor layer 101 in contact with the second metal layer 109 serves as a region that functions as an n-type semiconductor layer or a region that functions as a p-type semiconductor layer due to the work function difference between the metal forming the second metal layer 109, which has the third work function, and the semiconductor. Thus, the second metal layer 109 can be electrically connected to the lower portion of the pillar-shaped semiconductor layer 102. In addition, the second metal layer 109 and the lower portion of the pillar-shaped semiconductor layer 102 are separated from each other only by the first insulator 103, which functions as a gate insulating film. Thus, low resistance can be achieved between the second metal layer 109 and the lower portion of the pillar-shaped semiconductor layer 102. That is, low parasitic resistance can be achieved.

The second metal layer 109 extends over the planar semiconductor layer 101. Since the second metal layer 109 is made of a metal, low resistance can be achieved between the lower portion of the pillar-shaped semiconductor layer 102 and a contact connected to the second metal layer 109. The second metal layer 109 may also extend outside the planar semiconductor layer 101. In this case, the second metal layer 109 can be used as wiring for the lower portion of the pillar-shaped semiconductor layer 102.

The semiconductor device may have a diffusion layer in the upper portion of the planar semiconductor layer 101. The semiconductor device may also have a diffusion layer in the upper portion of the pillar-shaped semiconductor layer 102.

The semiconductor device further includes a third metal layer 113 connecting the first metal layer 110 to the upper portion of the pillar-shaped semiconductor layer 102. The first metal layer 110 can be electrically connected to the upper portion of the pillar-shaped semiconductor layer 102.

The semiconductor device further includes a second insulating film 112 between the first gate 104 and the first metal layer 110. The second insulating film 112 can electrically insulate the first gate 104 from the first metal layer 110.

The semiconductor device further includes a third insulating film 111 between the third gate 106 and the second metal layer 109. The third insulating film 111 can electrically insulate the third gate 106 from the second metal layer 109.

The semiconductor device further includes a fourth gate 107 surrounding the first insulator 103 and made of a metal having the second work function different from the first work function. The fourth gate 107 is located below the third gate 106. The fourth gate 107 is located above the second metal layer 109. The first gate 104, the second gate 105, the third gate 106, and the fourth gate 107 are electrically connected together. The semiconductor device further includes a fifth gate 108 surrounding the first insulator 103 and made of a metal having the first work function. The fifth gate 108 is located below the fourth gate 107. The fifth gate 108 is located above the second metal layer 109. The first gate 104, the second gate 105, the third gate 106, the fourth gate 107, and the fifth gate 108 are electrically connected together. Since the gates 104, 106, and 108 having the first work function and the gates 105 and 107 having the second work function alternately surround the pillar-shaped semiconductor layer 102, they can form a superlattice in the pillar-shaped semiconductor layer 102. The first work function and the second work function are different from each other.

In addition, since the gates 104, 106, and 108 having the first work function and the gates 105 and 107 having the second work function alternately surround the pillar-shaped semiconductor layer 102, if the first gate 104, the third gate 106, and the fifth gate 108 have a height that allows ballistic conduction, they form more than one series-connected transistors having ballistic conduction, thus providing a transistor having ballistic conduction with a long gate length.

The first gate 104, the third gate 106, and the fifth gate 108 preferably have the same height, whereas the second gate 105 and the fourth gate 107 preferably have the same height. If the first gate 104, the third gate 106, and the fifth gate 108 have the same height and the second gate 105 and the fourth gate 107 have the same height, they can form a periodic potential in the pillar-shaped semiconductor layer 102 due to the work function differences between the metals and the semiconductor. A periodic potential can be formed as long as the first work function and the second work function are different from each other.

As shown in FIGS. 2A and 2B, the semiconductor device may further include a fourth insulating film 214 formed between the first gate 104 and the second gate 105 and a fifth insulating film 215 formed between the second gate 105 and the third gate 106. The semiconductor device may further include a sixth insulating film 216 formed between the third gate 106 and the fourth gate 107. The semiconductor device may further include a seventh insulating film 217 formed between the fourth gate 107 and the fifth gate 108. These insulating films 214, 215, 216, and 217 isolate the gates 104, 105, 106, 107, and 108 from each other, thus reducing the mixing of a metal having the first work function and a metal having the second work function and the formation of a compound between a metal having the first work function and a metal having the second work function.

Preferably, each of the fourth insulating film 214, the fifth insulating film 215, the sixth insulating film 216, and the seventh insulating film 217 is an oxide film, a nitride film, an oxynitride film, or a high-k dielectric film or includes at least one of an oxide film, a nitride film, an oxynitride film, and a high-k dielectric film.

In this case, the gates 104, 105, 106, 107, and 108 need to be electrically connected together with contacts and wiring.

It should be understood that various embodiments and modifications are possible without departing from the broad spirit and scope of the invention. The foregoing embodiment is intended for purposes of illustration only and is not intended to limit the scope of the invention.

For example, in the foregoing embodiment, p-type (including $p^+$-type) and n-type (including $n^+$-type) may be replaced with their respective opposite conductivity types, and such semiconductor devices are, of course, included in the technical scope of the invention.

What is claimed is:

1. A semiconductor device comprising:
   a planar semiconductor layer on a substrate;
   a pillar-shaped semiconductor layer on the planar semiconductor layer;
   a first insulator surrounding the pillar-shaped semiconductor layer;
   a first gate surrounding the first insulator and comprising a metal having a first work function;
   a second gate surrounding the first insulator and comprising a metal having a second work function different from the first work function, the second gate below the first gate;
   a third gate surrounding the first insulator and comprising a metal having the first work function, the third gate below the second gate;
   a first metal layer surrounding the first insulator and having a third work function, the first metal layer above the first gate, the first metal layer electrically connected to an upper portion of the pillar-shaped semiconductor layer, and electrically insulated from the first gate; and
   a second metal layer surrounding the first insulator and having the third work function, the second metal layer below the third gate, the second metal layer electrically connected to a lower portion of the pillar-shaped semiconductor layer, and electrically insulated from the third gate,
   wherein the first gate, the second gate, and the third gate are electrically connected together.

2. The semiconductor device according to claim 1, wherein the second metal layer is in contact with an upper surface of the planar semiconductor layer.

3. The semiconductor device according to claim 1, wherein the second metal layer extends over the planar semiconductor layer.

4. The semiconductor device according to claim 1, further comprising a third metal layer connecting the first metal layer to the upper portion of the pillar-shaped semiconductor layer.

5. The semiconductor device according to claim 1, further comprising a second insulating film between the first gate and the first metal layer.

6. The semiconductor device according to claim 1, further comprising a third insulating film between the third gate and the second metal layer.

7. The semiconductor device according to claim 1, further comprising a fourth gate surrounding the first insulator and comprising a metal having the second work function different from the first work function, the fourth gate being located below the third gate, the fourth gate being located above the second metal layer,
   wherein the first gate, the second gate, the third gate, and the fourth gate are electrically connected together.

8. The semiconductor device according to claim 7, further comprising a fifth gate surrounding the first insulator and comprising a metal having the first work function, the fifth gate being located below the fourth gate, the fifth gate being located above the second metal layer,
   wherein the first gate, the second gate, the third gate, the fourth gate, and the fifth gate are electrically connected together.

9. The semiconductor device according to claim 1, wherein the third work function is 4.0 eV to 4.2 eV.

10. The semiconductor device according to claim 9, wherein the second work function is 4.0 eV to 4.2 eV.

11. The semiconductor device according to claim 10, wherein the first work function is 4.2 eV or more.

12. The semiconductor device according to claim 1, wherein the third work function is 5.0 eV to 5.2 eV.

13. The semiconductor device according to claim 12, wherein the second work function is 5.0 eV to 5.2 eV.

14. The semiconductor device according to claim 13, wherein the first work function is 5.0 eV or less.

15. The semiconductor device according to claim 1, further comprising:
    a fourth insulating film formed between the first gate and the second gate; and
    a fifth insulating film formed between the second gate and the third gate.

16. The semiconductor device according to claim 7, further comprising a sixth insulating film formed between the third gate and the fourth gate.

17. The semiconductor device according to claim 8, further comprising a seventh insulating film formed between the fourth gate and the fifth gate.

* * * * *